United States Patent [19]
Ichihashi

[11] Patent Number: 5,604,363
[45] Date of Patent: Feb. 18, 1997

[54] SEMICONDUCTOR PRESSURE SENSOR WITH PACKAGE

[75] Inventor: Motomi Ichihashi, Itami, Japan

[73] Assignee: Mitsubishi Denki Kabushiki Kaisha, Tokyo, Japan

[21] Appl. No.: 523,197

[22] Filed: Sep. 5, 1995

[30] Foreign Application Priority Data

Sep. 6, 1994 [JP] Japan ................................. 6-212846

[51] Int. Cl.⁶ ................................................ H01L 29/82
[52] U.S. Cl. ...................... 257/274; 257/417; 257/418; 257/419; 73/514.32; 73/514.33; 73/514.34; 73/DIG. 1; 73/DIG. 4
[58] Field of Search .................... 257/254, 417, 257/418, 419; 73/DIG. 1, DIG. 4, 514.34, 514.32, 514.33

[56] References Cited

U.S. PATENT DOCUMENTS 4,129,042  12/1978  Rosvold ................................ 73/727
5,436,491   7/1995  Hase et al. ..................... 257/419 X
5,459,351  10/1995  Bender ......................... 257/419 X

FOREIGN PATENT DOCUMENTS 4231325  4/1993  Germany ........................... 257/419
55-30842  3/1980  Japan ............................... 257/419
6151895   5/1994  Japan ............................... 257/417

*Primary Examiner*—William Mintel
*Attorney, Agent, or Firm*—Leydig, Voit & Mayer

[57] ABSTRACT

A less expensive small semiconductor pressure sensor in which a pressure sensing element is not displaced by vibration and the like and wire bonding is highly reliably effected includes a pressure sensing element having a diaphragm and a glass base die bonded to a die pad in substantially the same plane as that of an outer lead with a bonding resin. Each of two sets of hanging leads is attached to one of two opposite sides of the die pad to fix the die pad to a package base. With this arrangement, the die pad is securely bonded to the package base to prevent breakage of a metal wire caused by vibration and the like so that a less expensive and smaller semiconductor pressure sensor can be provided.

8 Claims, 3 Drawing Sheets

SEMICONDUCTOR PRESSURE SENSOR WITH PACKAGE

BACKGROUND OF THE INVENTION

1. Field of the Invention

The present invention relates to a semiconductor pressure sensor and, more specifically, to a semiconductor pressure sensor composed of a pressure sensitive element formed by anodic bonding and used in automobiles and the like.

2. Description of the Related Art

FIG. 5 is a cross sectional view showing a conventional semiconductor pressure sensor. In FIG. 5, a pressure sensing element 4 is composed of a pressure sensor chip 2 which has a diaphragm 1 and is anodically bonded to a glass base 3. The pressure sensing element 4 is die bonded to a sunk die pad 5a by a bonding resin 6. Further, the pressure sensor chip 2 is electrically connected to an outer lead 7 through a metal wire 8.

The sunk die pad 5a and the outer lead 7 are integrally formed as a lead frame in a manufacturing process. A pressure sensor element 12 is formed in such a manner that the lead frame is fixed by, for example, a bonding resin 11, such as an epoxy resin or the, like and held between a package cover and a package base 10 and the frame of the lead frame is cut off. The pressure sensor element 12 is mounted on a thick film substrate 13 with a lead wire such as, for example, a ceramic substrate or a hybrid IC substrate by the outer lead 7 through solder 14 to make a semiconductor pressure sensor 15.

The conventional semiconductor pressure sensor 15 is arranged as described above and the diaphragm 1 of the pressure sensor chip 2 includes a vacuum chamber produced by anodically bonding the pressure sensor chip 2 to the glass base 3 in a vacuum. The vacuum serves as a reference pressure. When an external pressure is applied to the surface of the pressure sensor chip 2 through the opening of the package cover 9, an output signal is produced in accordance with the external pressure by a bridge circuit of gauge resistors (not shown). The diaphragm 1 formed by a thin wall is strained and the gauge resistors on the surface of the pressure sensor chip 2 are changed in resistance by a piezoresistance effect. The thus-produced output signal is sensed through the outer lead 7 and the metal wire 8.

In the aforesaid semiconductor pressure sensor, when the die pad is sunk, the sunk die pad 5a may not be in contact with the package base 10 because the amount of sinking of the die pad 5a varies. Since the sunk die pad 5a is fixed to the package base 10 only on the one side thereof by hanging leads 16 as shown in FIG. 6, there is a problem in that the pressure sensing element 4 is displaced by vibrations and the like and the metal wire 8 may be broken and the electrical signal of the pressure sensor chip 2 disrupted.

Further, there is also a problem that since the die pad is sunk, the size of a package is increased and processing is difficult.

SUMMARY OF THE INVENTION

An object of the present invention made to solve the above problems is to provide a less expensive small semiconductor pressure sensor in which a pressure sensitive element is not displaced by vibrations and the like and wire bonding is highly reliably effected.

According to an aspect of the present invention there is provided a semiconductor pressure sensor, which comprises a pressure sensitive element composed of a pressure sensor chip having a diaphragm formed thereon and bonded to a glass base by anode coupling, a package base for supporting the pressure sensitive element, a package cover constituting a package for accommodating the pressure sensitive element therein in combination with the package base, an outer lead being held between the package base and the package cover, a bonding resin for bonding the package base, the package cover and the outer lead, a die pad having the pressure sensitive element mounted thereon and fixed to the package base as well as disposed on the same plane as that of the outer lead, a bonding resin for bonding said pressure sensitive element, the die pad and the package base, a metal wire for electrically connecting the pressure sensitive element to said outer lead and a thick film substrate on which said package is mounted by said outer lead.

According to another aspect of the present invention there is provided a semiconductor pressure sensor, which comprises a pressure sensitive element composed of a pressure sensor chip having a diaphragm formed thereon and bonded to a glass base by anode coupling, a thick film substrate for supporting the pressure sensitive element, a package cover disposed to the thick film substrate for covering the pressure sensitive element, a bonding resin for bonding the package cover to the thick film substrate, a bonding resin for bonding the pressure sensitive element to the thick film substrate, and a metal wire for electrically connecting the pressure sensitive element to the thick film substrate.

DESCRIPTION OF PREFERRED EMBODIMENTS

Embodiment 1

Figure 1:
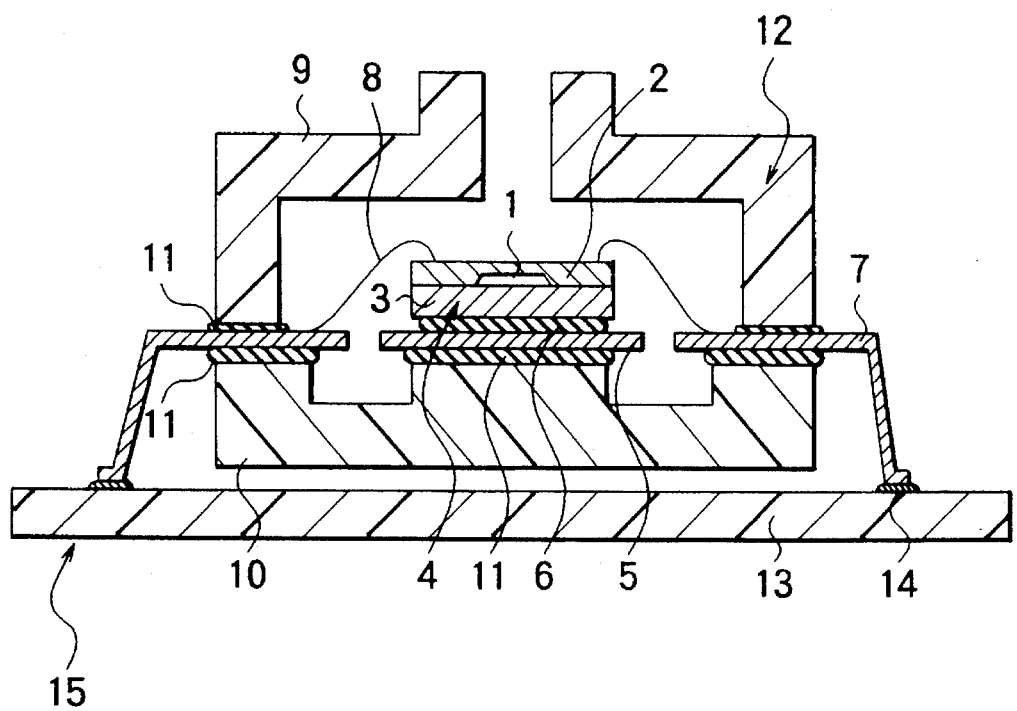
FIG. 1 is a cross sectional view showing a semiconductor pressure sensor according to an embodiment 1 of the present invention.
Figure 2:
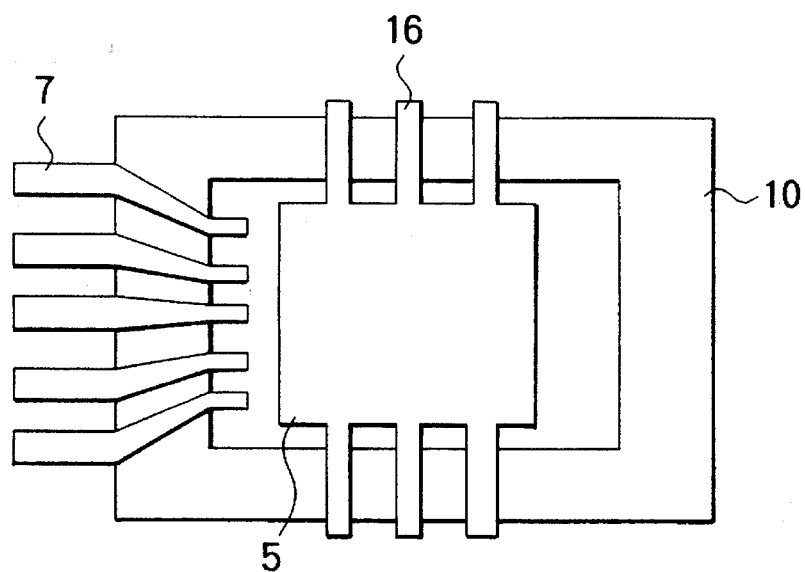
FIG. 2 is a schematic plan view showing a die pad fixed to a package base by two sets of hanging leads in the embodiment 1.

FIG. 1 is a cross sectional view showing a semiconductor pressure sensor according to an embodiment 1 of the present invention. Note, the same numerals used in respective figures denote the same or corresponding parts. In FIG. 1, a pressure sensing element 4 is formed by anodic bonding a pressure sensor chip 2 having a diaphragm 1 to a glass base 3. The pressure sensing element 4 is die bonded by a bonding resin 6 to a die pad 5 which is not sunk. The die pad 5 is disposed in substantially the same plane as an outer lead 7. Further, as shown in FIG. 2, each of two sets of hanging leads 16 is attached to one of two opposite sides of the die pad 5. Note, an outer lead 7 on one side is not shown in FIG. 2.

In the semiconductor pressure sensor arranged as described above, the glass base 3 conventionally requires a thickness of about 3 mm to reduce external stress. However, since the bonding resin 6 (die bonding resin) can absorb the external stress with increased thickness, the thickness of the glass base 3 can be reduced to 1 mm or less, such as, for example, 0.5 mm. A step produced when a metal wire 8 is wire bonded can be lowered by making the thickness of the glass base 3 1 mm or less, whereby the reliability of wire bonding and the ease of a wire bonding job can be secured. A silicone resin, for example, can be used as the bonding resin 6. The thickness of the bonding resin 6 can be increased so that after the bonding resin 6 is applied to the die pad 5, the bonding resin 6 is cured with heat, the bonding resin 6 is applied again and the pressure sensing element 4 is mounted, and then the bonding resin 6 is cured with heat. As another method, the thickness of the bonding resin 6 can be also increased by defining a groove (not shown) in the central portion of the die pad 5.

Embodiment 2

Figure 3:
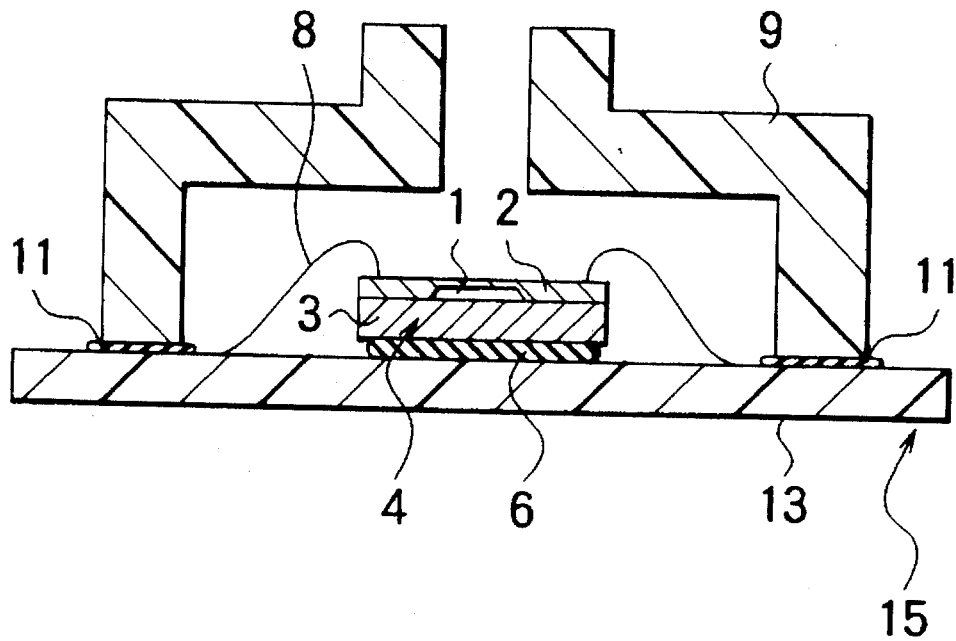
FIG. 3 is a cross sectional view showing a semiconductor pressure sensor according to an embodiment 2 of the present invention.

FIG. 3 is a cross sectional view showing a semiconductor pressure sensor according to an embodiment 2 of the present invention. In FIG. 3, a pressure sensing element 4 including a pressure sensor chip 2 having a diaphragm 1 and a glass base 3 is directly die bonded to a thick film substrate 13 by a bonding resin 6. A metal pad of the thick film substrate 13 is electrically connected to the pressure sensitive chip 2 by a metal wire 8. The pressure sensing element 4, the metal wire 8 and the like are covered with a package cover 9 for their protection and bonded to the thick film substrate 13 with a bonding resin 11.

At the time, a step produced when wire bonding is effected can be lowered by making the thickness of the glass base 3 1 mm or less, so that direct wire bonding can be effected to the metal pad of the thick film substrate 13. Note, a method similar to that of the embodiment 1 can be applied as a method of increasing the thickness of the bonding resin 6.

With the aforesaid arrangement, a conventional pressure sensor element 12 need not be assembled. Thus, a less expensive small semiconductor pressure sensor 15 can be produced.

Embodiment 3

Figure 4:
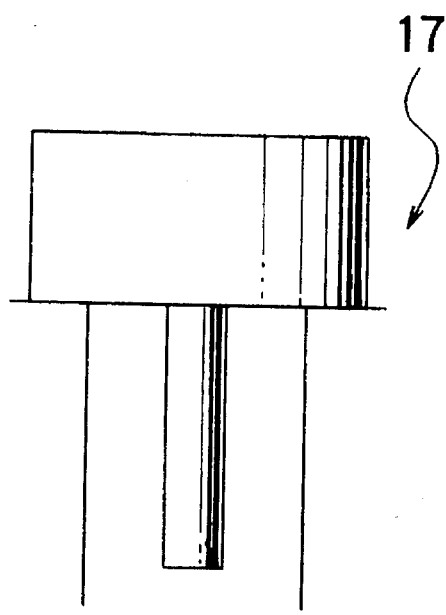
FIG. 4 is a schematic side elevational view showing a pressure sensor element used in an embodiment 3 of the present invention.
Figure 5:
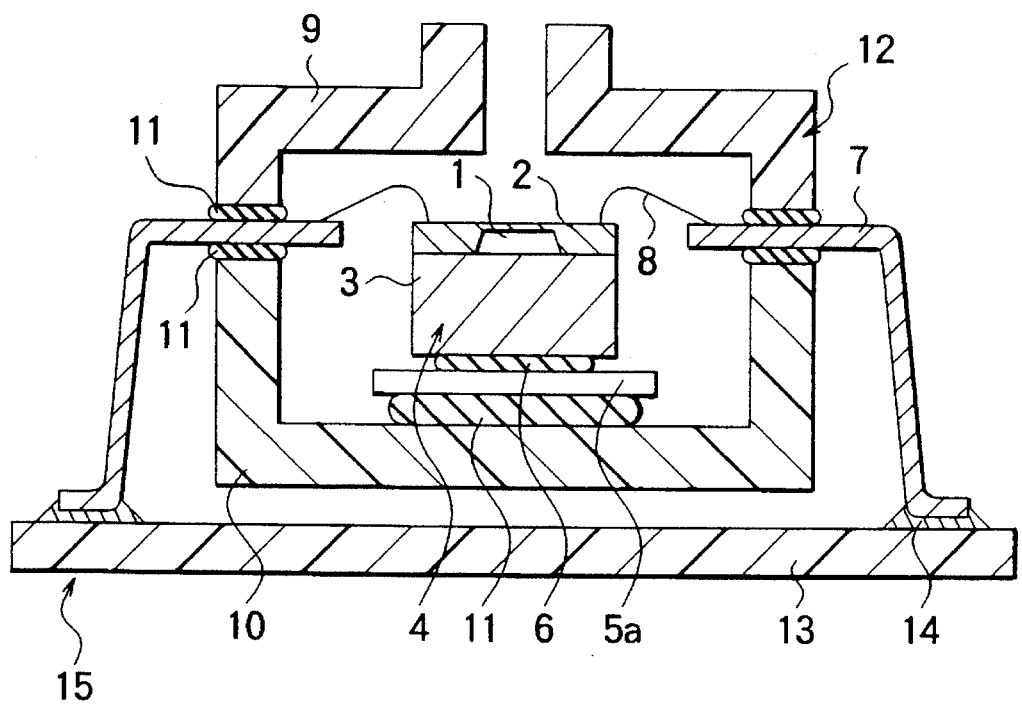
FIG. 5 is a cross sectional view showing a conventional semiconductor pressure sensor.
Figure 6:
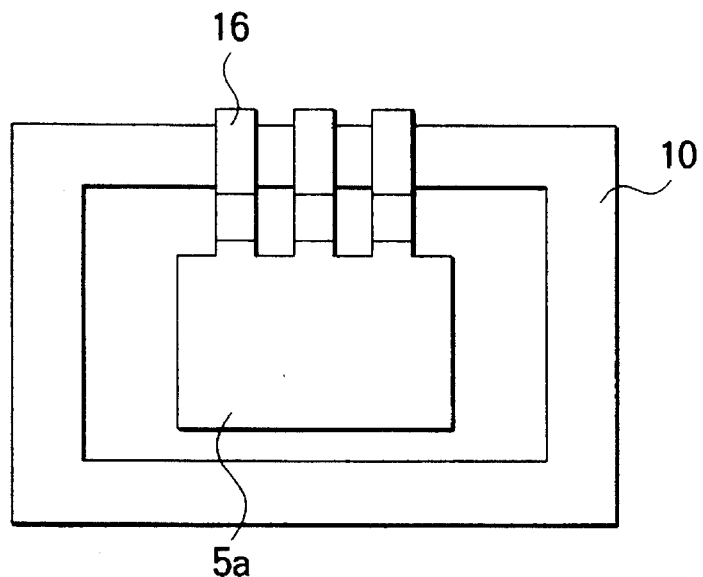
FIG. 6 is a schematic plan view showing a die pad fixed to a package base by hanging leads in the conventional semiconductor pressure sensor.

FIG. 4 is a schematic side elevational view showing a pressure sensor element used in an embodiment 3 of the present invention. In the embodiment 3, an amplifier circuit for another pressure sensor element 17 is provided with the pressure sensor chip 2 shown in FIG. 3 in addition to a pressure detecting circuit. With this arrangement, an amplifier circuit for the other pressure sensor element 17 need not be separately provided by using the semiconductor pressure sensor 15 in combination with the other pressure sensor element 17, thus the number of parts can be reduced. For example, a hybrid IC thick film substrate on which an operational amplifier IC would be otherwise needed for the other pressure sensor element 17, such a hybrid IC thick film substrate becomes unnecessary by the provision of the amplifier circuit of the pressure sensor element 17 with the pressure sensor chip 2.

Further, all the types of pressure sensor elements can be combined by providing amplifier circuits for a plurality of pressure sensor elements for different applications such as the measurement of atmospheric pressure, the measurement of a hydraulic pressure and the like with the pressure sensor chip 2 and selectively wire bonding them to the thick film substrate 13.

What is claimed is:

1. A semiconductor pressure sensor comprising:

a pressure sensing element including a glass base and a pressure sensor chip having a diaphragm anodically bonded to said glass base;

a package accommodating said pressure sensing element and including a package cover and a package base supporting said pressure sensing element;

an outer lead held between said package base and said package cover;

a first bonding resin bonding said package base, said package cover, and said outer lead together;

a die pad on which said pressure sensing element is mounted, fixed to said package base, and coplanar with said outer lead;

a second bonding resin bonding said pressure sensing element, said die pad, and said package base together;

a metal wire electrically connecting said pressure sensing element to said outer lead; and a thick film substrate to which said outer lead is mounted.

2. The semiconductor pressure sensor according to claim 1 including hanging leads fixing said die pad to said package base and attached to opposite sides of said die pad.

3. The semiconductor pressure sensor according to claim 1 wherein said glass base has a thickness of no more than 1 mm.

4. The semiconductor pressure sensor according to claim 1 wherein said second bonding resin between said pressure sensing element and sad die pad is relatively thick to absorb vibrations.

5. A semiconductor pressure sensor comprising:

a pressure sensing element including a glass base and a pressure sensor chip having a diaphragm anodically bonded to said glass base;

a thick film substrate supporting said pressure sensing element;

a package cover disposed on said thick film substrate covering said pressure sensing element;

a first bonding resin bonding said package cover to said thick film substrate;

a second bonding resin bonding said pressure sensing element to said thick film substrate; and a metal wire electrically connecting said pressure sensing element to said thick film substrate.

6. The semiconductor pressure sensor according to claim 5 wherein said glass base has a thickness of no more than 1 mm.

7. A semiconductor pressure sensor according to claim 5 wherein said pressure sensor chip includes a pressure detecting circuit and at least two amplifier circuits.

8. The semiconductor pressure sensor according to claim 2 wherein said glass base has a thickness of no more than 1 mm.

* * * * *